United States Patent
Lee et al.

(10) Patent No.: US 8,373,444 B2
(45) Date of Patent: Feb. 12, 2013

(54) TIME-DOMAIN VOLTAGE COMPARATOR FOR ANALOG-TO-DIGITAL CONVERTER

(75) Inventors: Seon Kyoo Lee, Pohang-si (KR); Jae Yoon Sim, Pohang-si (KR)

(73) Assignee: Postech Academy-Industry Foundation, Pohang-si, Gyeongsangbuk-Do (KR)

( * ) Notice: Subject to any disclaimer, the term of this patent is extended or adjusted under 35 U.S.C. 154(b) by 0 days.

(21) Appl. No.: 12/663,732

(22) PCT Filed: Oct. 7, 2009

(86) PCT No.: PCT/KR2009/005718
§ 371 (c)(1),
(2), (4) Date: Dec. 9, 2009

(87) PCT Pub. No.: WO2011/037292
PCT Pub. Date: Mar. 31, 2011

(65) Prior Publication Data
US 2012/0176158 A1    Jul. 12, 2012

(30) Foreign Application Priority Data
Sep. 23, 2009    (KR) .................. 10-2009-0090204

(51) Int. Cl.
*G01R 25/00*    (2006.01)

(52) U.S. Cl. .................. 327/3; 327/104; 341/166

(58) Field of Classification Search .................. 327/2, 3, 327/12, 50, 63, 64, 104; 341/166
See application file for complete search history.

(56) References Cited

U.S. PATENT DOCUMENTS

| 5,432,826 A * | 7/1995 | Rieder ................... 375/371 |
| 7,916,064 B2 * | 3/2011 | Lin et al. ................ 341/166 |
| 2012/0133540 A1 * | 5/2012 | Choi et al. .............. 341/166 |

FOREIGN PATENT DOCUMENTS

| KR | 10-2007-0058395 A | 6/2007 |
| KR | 10-2009-0063951 A | 6/2009 |
| WO | 2007-019288 A1 | 2/2007 |

OTHER PUBLICATIONS

International Search Report, Appln No. PCT/KR2009/005718, dated Oct. 25, 2010.
J. L. Cura et al., "A Novel 12-Bit, 3us, Integrating-Type CMOS Analog-To-Digital Converter," Proceedings, XI Brazilian Symposium on Integrated Circuit Design, pp. 74-77, Sep. 30, 1998.
PCT Written Opinion of the International Searching Authority, Appl. No. PCT/KR2009/005718, dated Oct. 25, 2010.
"A 1.3micro-W 0.6V 8.7-ENOB Successive Approximation ADC in a 0.18micrometer CMOS", Seon-Kyoo Lee et al., 2009 Symposium on VLSI Circuits Digest of Technical Papers, pp. 242-243.

* cited by examiner

*Primary Examiner* — Lincoln Donovan
*Assistant Examiner* — William Hernandez
(74) *Attorney, Agent, or Firm* — Kile Park Goekjian Reed & McManus PLLC

(57) ABSTRACT

A time-domain voltage comparator for an analog-to-digital converter includes a first voltage-to-time converter configured to be connected in series with at least one time delay cell and convert an input voltage into time information; a second voltage-to-time converter configured to be connected in series with at least one time delay cell and convert an input voltage into time information; and a phase comparator configured to determine a difference between times outputted from the first voltage-to-time converter and the second voltage-to-time converter.

20 Claims, 9 Drawing Sheets

|  | Present Invention | ISSCC2008 |
|---|---|---|
| Std. deviation | 0.49 mV | 3.35 mV |
| Gain | 2ns/mV | 0.7ns/mV |

TIME-DOMAIN VOLTAGE COMPARATOR FOR ANALOG-TO-DIGITAL CONVERTER

BACKGROUND OF THE INVENTION

1. Field of the Invention

The present invention relates to an analog-to-digital converter, and more particularly, to a time-domain voltage comparator for an analog-to-digital converter which can convert voltage differences into time differences.

2. Description of the Related Art

In general, an analog-to-digital converter (ADC) is a circuit for converting an analog signal into a digital signal and is used as one of essential blocks not only in the field of wireless communication but also in all the fields of signal processing.

In particular, in the case of application fields, such as a portable terminal or a wireless sensor network, in which power supply depends on a battery and therefore available energy is extremely limited, it is essential to decrease a supply voltage and minimize power consumption.

In this regard, if the supply voltage is decreased, the reliability of an analog circuit markedly deteriorates when compared to a digital circuit, and therefore, a problem is caused in that the stable operation of an analog-to-digital converter cannot be ensured.

FIG. 1 is a block diagram illustrating a conventional fully-differential analog-to-digital converter.

Referring to FIG. 1, a conventional fully-differential analog-to-digital converter 100 includes a first digital-to-analog converter (DAC) 110, a second digital-to-analog converter 120, a comparator 130 which is configured to compare input voltages outputted from the converters 110 and 120, and a successive approximation register (SAR) 140.

Operation of the conventional fully-differential analog-to-digital converter 100 will be described with reference to FIG. 1.

First, the first digital-to-analog converter 110 and the second digital-to-analog converter 120 convert digital signals into analog voltages and output the analog voltages. The comparator 130 compares the magnitude of the output voltage of the first digital-to-analog converter 110 and the magnitude of the output voltage of the second digital-to-analog converter 120.

Then, as a result of the comparison, the comparator 130 outputs information about which one of the magnitudes is greater, as one digital value.

A time-domain voltage comparator stands for a voltage comparator which does not directly compare two input voltages, converts the respective input voltages into information for times, and compares the times.

While this kind of comparator has been introduced on the ISSCC in 2008, excellent results have not been obtained with respect to reducing a voltage of supply power and an offset.

FIG. 2 is a circuit diagram illustrating a conventional time-domain voltage comparator.

Referring to FIG. 2, a conventional time-domain voltage comparator 200 includes a first voltage-to-time converter 210, a second voltage-to-time converter 220, and a D flip-flop 230.

Operation of the conventional time-domain voltage comparator 200 configured as shown in FIG. 2 will be described below with reference to the circuit diagram of each of the first and second voltage-to-time converters 210 and 220.

The first voltage-to-time converter 210 and the second voltage-to-time converter 220 have the same circuit configuration as shown in FIG. 2. Operations of the first and second voltage-to-time converters 210 and 220 will be described below.

First, when a clock signal CLK is low, a PMOS M1 is turned on and an NMOS M3 is turned off. According to this fact, a voltage of a power supply terminal VDD is charged to a capacitor C through the PMOS M1, and the charged voltage is supplied to the gate terminal of a PMOS M2, by which the PMOS M2 is turned off. Therefore, an output OUT is maintained at a low state.

Conversely, when the clock signal CLK transits to high, the PMOS M1 is turned off and the NMOS M3 is turned on. The clock signal CLK of a high level is inverted through an inverter I1 to a low level and is commonly supplied to the gate terminals of NMOSes M5 and M6, by which the NMOSes M5 and M6 are turned off. At this time, a degree to which an NMOS M4 is turned on is determined by the magnitude of an input voltage Vin. If a high input voltage Vin is applied, the NMOS M4 is sufficiently turned on to have a low resistance value, and if a low input voltage Vin is applied, the NMOS M4 is insufficiently turned on to have a high resistance value.

At the same time, the voltage charged to the capacitor C gradually discharges through the NMOSes M3 and M4 and a resistor R. According to this fact, the PMOS M2 is slowly turned on, and the voltage of the power supply terminal VDD is outputted through the PMOS M2 and inverters I2 and I3 serially connected thereto. The output OUT becomes high.

If two voltage-to-time converters operating in this way are used, an output of one converter which receives a higher input voltage between two input voltages V+ and V− transits more quickly, and an output of the other inverter which receives a negative input voltage between the two input voltages V+ and V− transits more slowly.

After a difference in input voltage is converted into a difference in transition time through a series of above-described processes, two outputs converted in these ways are inputted to a data terminal D and a clock signal terminal of a D flip-flop D-F/F. As a consequence, it is possible to know an output of which one of the two converters has transited more quickly, based on outputs OUT and $\overline{\text{OUT}}$ of the D flip-flop D-F/F.

However, this type of comparator has two problems as described below, in the light of an offset.

First, if matching of the two voltage-to-time converts is not precisely implemented, even though the same input voltage is supplied, times during which the outputs transit become different, and due to this fact, an offset occurs.

Second, even when matching of the two voltage-to-time converts is precisely implemented, an offset is likely to occur due to a set-up time and a hold time as the inherent characteristics of the D flip-flop.

SUMMARY OF THE INVENTION

Accordingly, the present invention has been made in an effort to solve the problems occurring in the related art, and an object of the present invention is to minimize an analog circuit so as to ensure stable operation even in a low voltage condition when realizing a time-domain voltage comparator for an analog-to-digital converter which converts information for voltage differences into information for time differences, compares the time differences and outputs a comparison result.

Another object of the present invention is to provide a time-domain voltage comparator for an analog-to-digital converter which uses a plurality of time delay units in the course of converting voltage differences into time differences so that insensitivity to the thermal noise of transistors is improved when compared to the conventional comparator and an offset is decreased.

In order to achieve the above objects, according to an aspect of the present invention, there is provided a time-domain voltage comparator for an analog-to-digital converter, comprising a first voltage-to-time converter configured to be connected in series with at least one time delay cell and convert an input voltage into time information; a second voltage-to-time converter configured to be connected in series with at least one time delay cell and convert an input voltage into time information; and a phase comparator configured to determine a difference between times outputted from the first voltage-to-time converter and the second voltage-to-time converter.

Preferably, in each time delay cell, a transistor is added in series to a pull-up path or a pull-down path of an inverter in such a way as to control a time to be taken for a rising edge or a falling edge to reach an output terminal, depending upon an input voltage.

Preferably, the phase comparator is inputted with a rising edge from the first voltage-to-time converter and a rising edge from the second voltage-to-time converter and has the same symmetrical paths from input terminals to output terminals thereof.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
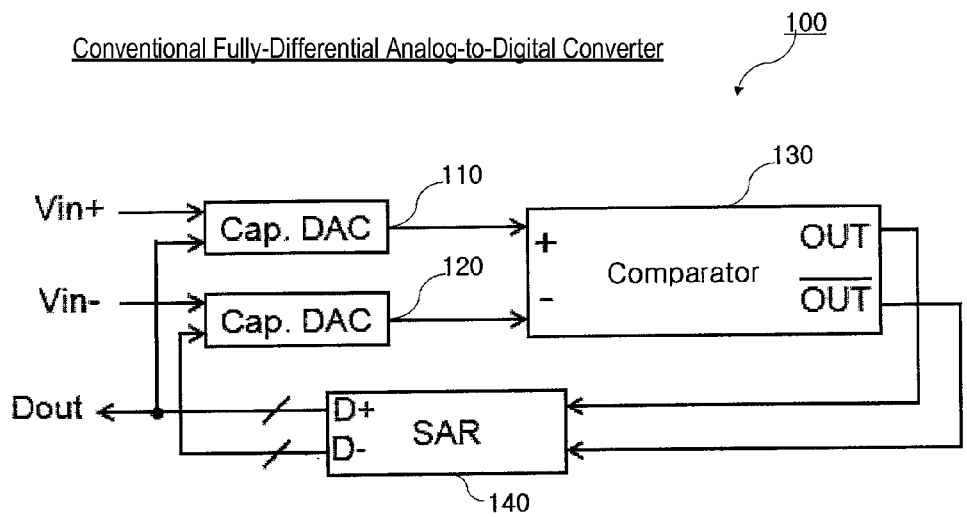
FIG. 1 is a block diagram illustrating the configuration of a conventional fully-differential analog-to-digital converter.
Figure 2:
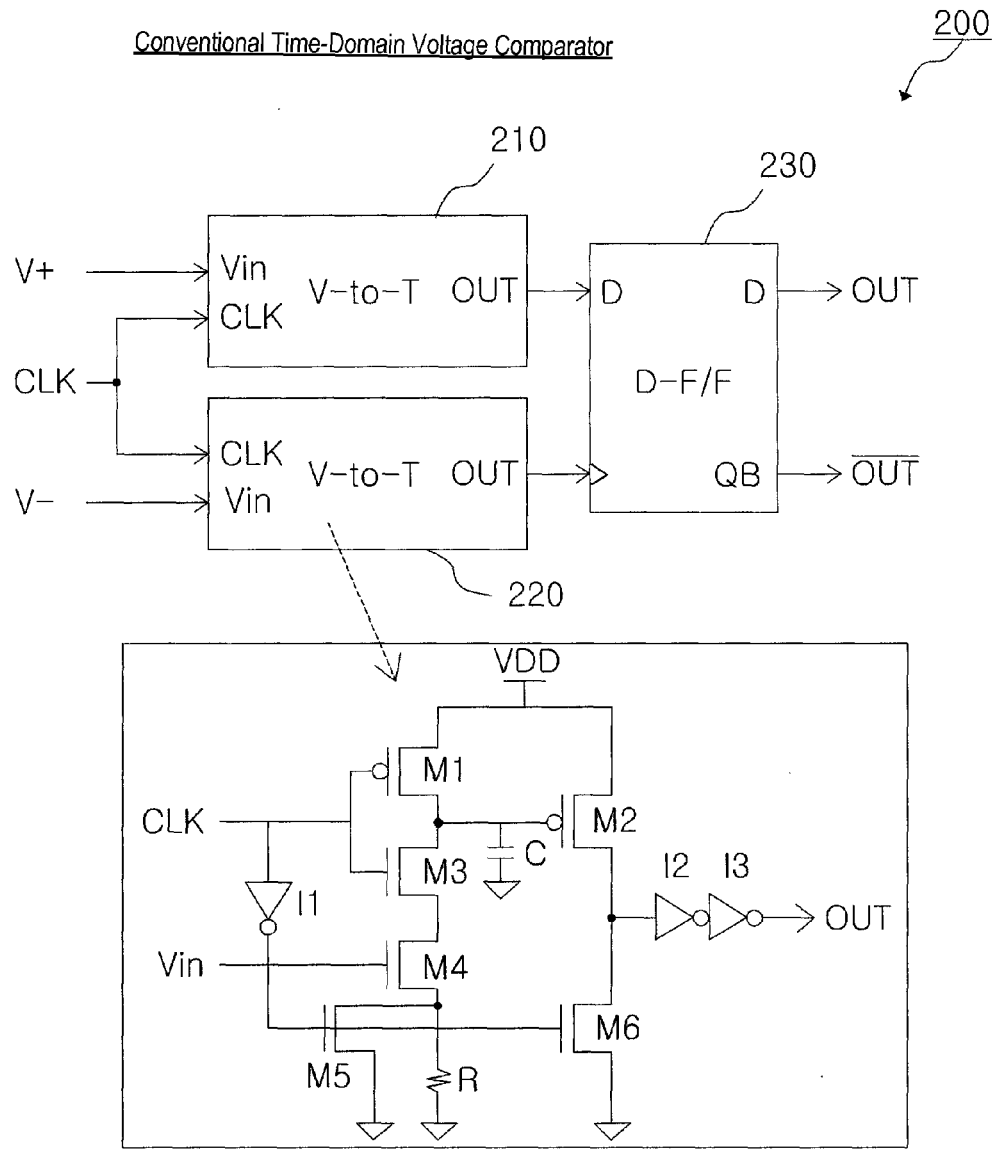
FIG. 2 is a circuit diagram illustrating a conventional time-domain voltage comparator.

Reference will now be made in greater detail to preferred embodiments of the invention, examples of which are illustrated in the accompanying drawings. Wherever possible, the same reference numerals will be used throughout the drawings and the description to refer to the same or like parts.

The basic principle of the present invention resides in that a plurality of time delay cells are provided so that match between voltage-to-time converters is improved and analog elements (such as capacitors and resistors) are removed so that an area can be efficiently decreased.

In the following description of the present invention, detailed explanations of known functions and configurations associated herewith will be omitted when they can make the subject matter of the present invention rather unclear.

Figure 3:
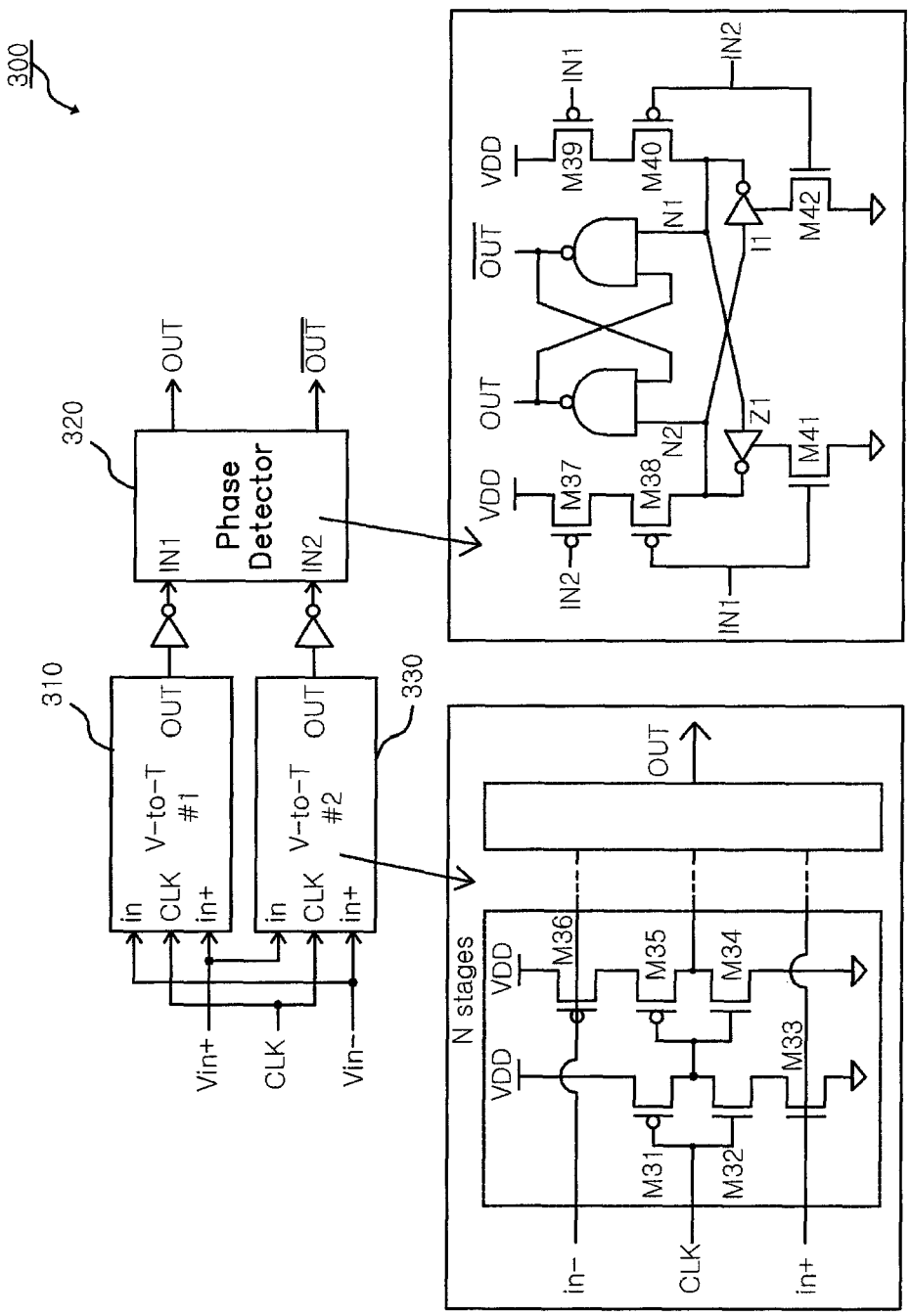
FIG. 3 is a block diagram illustrating the configuration of a time-domain voltage comparator for an analog-to-digital converter in accordance with an embodiment of the present invention.

FIG. 3 is a block diagram illustrating the configuration of a time-domain voltage comparator for an analog-to-digital converter in accordance with an embodiment of the present invention.

Referring to FIG. 3, a time-domain voltage comparator 300 in accordance with an embodiment of the present invention includes a first voltage-to-time converter 310 configured to convert an inputted voltage into a time, a second voltage-to-time converter 330 configured to convert an inputted voltage into a time, and a phase detector 320 configured to detect the phases of time information converted in the first voltage-to-time converter 310 and the second voltage-to-time converter 330.

The time-domain voltage comparator 300 in accordance with the embodiment of the present invention, constructed as shown in FIG. 3, is characterized in that transition times of rising edges are controlled by controlling both pull-up paths and pull-down paths.

Operation of the time-domain voltage comparator 300 in accordance with the embodiment of the present invention, constructed as shown in FIG. 3, will be described with reference to the circuit diagrams given in FIG. 3.

Each of the first and second voltage-to-time converters 310 and 330 uses N stages of time delay cells and therefore can improve matchability between the first and second voltage-to-time converters 310 and 330.

A capacitor and a resistor which occupy a large area in an integrated circuit are removed from each time delay cell so that an area of the integrated circuit can be effectively reduced.

In the respective voltage-to-time converters 310 and 330, if a clock signal CLK is low, a low level is quickly transmitted to an output terminal as in an inverter chain so as to be ready to receive a rising edge.

That is to say, if the clock signal CLK is low, a first PMOS (a P-channel MOS transistor) M31 is turned on, and a first NMOS (an N-channel MOS transistor) M32 is turned off.

Accordingly, a voltage of a power supply terminal VDD is supplied to the gate terminals of a second PMOS M35 and a second NMOS M34 through the first PMOS M31. Accordingly, the second PMOS M35 is turned off, whereas the second NMOS M34 is turned on. Due to this fact, an output OUT is maintained at a low level.

Thereafter, if the clock signal CLK transits to a high level, the transition times of outputs have a difference depending upon positive and negative input voltages Vin+ and Vin−. For example, if a range of an allowable input voltage of the time-domain voltage comparator 300 is 0.5V, a common voltage is 0.25V, and if a positive input voltage Vin+ is 0.26V and a negative input voltage Vin− is 0.24V, a voltage difference becomes 0.02V.

In this state, if the positive input voltage Vin+ is higher than the negative input voltage Vin−, the output OUT of the first voltage-to-time converter 310 transits earlier than the output OUT of the second voltage-to-time converter 330. In an opposite case, the output OUT of the second voltage-to-time converter 330 transits earlier.

In other words, in the first voltage-to-time converter 310, the positive input voltage Vin+ is inputted to the gate terminal of an input NMOS M33, and the negative input voltage Vin− is inputted to the gate terminal of a PMOS M36. Accordingly, as the positive input voltage Vin+ becomes high and the negative input voltage Vin− becomes low, quick transition of the output OUT is enabled.

Also, in the second voltage-to-time converter 330 having the same circuit configuration as the first voltage-to-time converter 310, the negative input voltage Vin− is inputted to the gate terminal of the input NMOS M33, and the positive input voltage Vin+ is inputted to the gate terminal of the PMOS M36. Accordingly, as the negative input voltage Vin− becomes high and the positive input voltage Vin+ becomes low, quick transition of the output OUT is enabled.

At this time, by using the N stages of time delay cells, an offset can be reduced to $1/\sqrt{N}$ when compared to the conventional comparator which uses only one stage of time delay cell.

The phase detector 320 determines a difference between the transition times of the outputs OUT of the first voltage-to-time converter 310 and the second voltage-to-time converter 330.

Preferably, two inputs to the phase detector 320 are precisely symmetric to each other.

As shown in FIG. 3, the phase detector 320 includes a third PMOS M37 having a gate terminal through which an output of the second voltage-to-time converter 330 is received; a fourth PMOS M38 having a source terminal which is connected to the drain terminal of the third PMOS M37, a gate terminal to which the output of the first voltage-to-time converter 310 is supplied, and a drain terminal which is connected to an input terminal of a second inverter I2 as a component of a latch; a third NMOS M41 having a gate terminal to which the output of the first voltage-to-time converter 310 is supplied, a drain terminal which is connected to an input terminal of a first inverter I1 as a component of the latch, and a source terminal which is connected to a ground terminal; a fifth PMOS M39 having a source terminal which is connected to the power supply terminal VDD, and a gate terminal to which the output of the first voltage-to-time converter 310 is supplied; a sixth PMOS M40 having a source terminal which is connected to the drain terminal of the fifth PMOS M39, a gate terminal to which the output of the second voltage-to-time converter 330 is supplied, and a drain terminal which is connected to the input terminal of the first inverter I1; a fourth NMOS M42 having a gate terminal to which the output of the second voltage-to-time converter 330 is supplied, a drain terminal which is connected to the input terminal of the second inverter I2, and a source terminal which is connected to the ground terminal; an inverter latch composed of the first inverter I1 and the second inverter I2 to latch the transition of the outputs of the first voltage-to-time converter 310 and the second voltage-to-time converter 330; and an RS latch flip-flop composed of a first NAND gate N1 and a second NAND gate N2 which outputs values latched by the latch in synchronism with one of the outputs of the first voltage-to-time converter 310 and the second voltage-to-time converter 330 that transits earlier.

Operation of the phase detector 320 of the time-domain voltage comparator 300 for an analog-to-digital converter in accordance with the embodiment of the present invention will be described below.

In the phase detector 320, when two inputs IN1 and IN2 are low, the NMOSes M41 and M42 are turned off, and PMOSes M39 and M40, and M37 and M38 are turned on. Accordingly, paths connected to the ground terminal are shut off, and the two output nodes of the latch composed of the first inverter I1 and the second inverter I2 are precharged by the voltage of the power supply terminal VDD that is supplied through the PMOSes M37 and M38, and M39 and M40.

Thereafter, if any one of the two inputs IN1 and IN2 transits earlier to a high level, precharge paths are shut off by the transition, and values corresponding to the transition are latched by the inverter latch and are then outputted through the RS latch flip-flop. In the inverter latch, since the two inverters I1 and I2 are connected to receive, as inputs, the outputs of each other, when the levels of the two inverters I1 and I2 are opposite, a stable state prevails, and when the levels of values inputted due to the precharge are all high, an unstable state prevails.

This will be described below in detail.

If the output OUT of the first voltage-to-time converter 310 between the first voltage-to-time converter 310 and the second voltage-to-time converter 330 first transits to a high level, the input IN1 to the phase detector 320 becomes high, and the other input IN2 becomes high afterwards or is maintained at a low level as it is. Accordingly, the PMOSes M38 and M39 are turned off, the corresponding precharge paths are shut off, and the NMOS M41 is first turned on.

Thus, the voltage of one input terminal of the first NAND gate N1 of the inverter latch which is in the unstable state is first quickly discharged through the output terminal of the inverter I1 and the NMOS M41, and is then latched. However, since the inverter latch which is in the unstable state has already quickly returned to the stable state due to discharge through the NMOS M41 and has latched the voltage, the voltage of the one input terminal of the first NAND gate N1 is continuously maintained at a low level by the precharge, irrespective of the late turn-on of the NMOS M42 which receives a signal that transits to a high level in response to the other input IN2.

Therefore, because inputs to the first NAND gate N1 and the second NAND gate N2 respectively become low and high, a low level is outputted as an output OUT, and a high level is outputted as an inverted output $\overline{OUT}$.

Conversely, If the output OUT of the second voltage-to-time converter 330 between the first voltage-to-time converter 310 and the second voltage-to-time converter 330 first transits to a high level, the input IN2 to the phase detector 320 becomes high, and the other input IN1 becomes high afterwards or is maintained at a low level as it is. Accordingly, the PMOSes M37 and M40 are turned off, the corresponding precharge paths are shut off, and the NMOS M42 is first turned on.

Thus, the voltage of one input terminal of the second NAND gate N2 of the inverter latch which is in the unstable state is first quickly discharged to the ground terminal through the output terminal of the inverter I2 and the NMOS M42. However, since the inverter latch which is in the unstable state has already quickly returned to the stable state due to discharge through the NMOS M42 and has latched the voltage, the voltage of the one input terminal of the second NAND gate N2 is continuously maintained at a low level by the precharge, irrespective of the late turn-on of the NMOS M41 which receives a signal that transits to a high level in response to the other input IN1.

Therefore, because inputs to the first NAND gate N1 and the second NAND gate N2 respectively become high and low, a high level is outputted as an output OUT, and a low level is outputted as an inverted output $\overline{OUT}$.

If all the inputs to the first NAND gate N1 and the second NAND gate N2 are high by the outputs OUT of the first voltage-to-time converter 310 and the second voltage-to-time converter 330, the values of the output OUT and the inverted output $\overline{OUT}$ maintain previous values as they are.

Also, if all the inputs to the first NAND gate N1 and the second NAND gate N2 are low, the output OUT and the inverted output $\overline{OUT}$ become high levels, which is not preferable. However, since this situation cannot be the case due to the operational characteristics of the phase detector 320, it is not needed to be considered.

As a consequence, the RS latch flip-flop normally outputs the high levels precharged to the inverter latch as the output OUT and the inverted output $\overline{OUT}$, and outputs corresponding values in synchronism with one of the outputs of the first voltage-to-time converter 310 and the second voltage-to-time converter 330 that transits first.

The phase detector 320 can be characterized in that data and the clock signal are used without distinction and the input terminals of the inputs IN1 and IN2 and the output terminals of the outputs OUT and $\overline{OUT}$ have precisely symmetrical structures. Hence, unlike the D flip-flop D-F/F, since the loads and operations of the two input terminals are precisely the same, an offset can be substantially perfectly eliminated.

Figure 4:
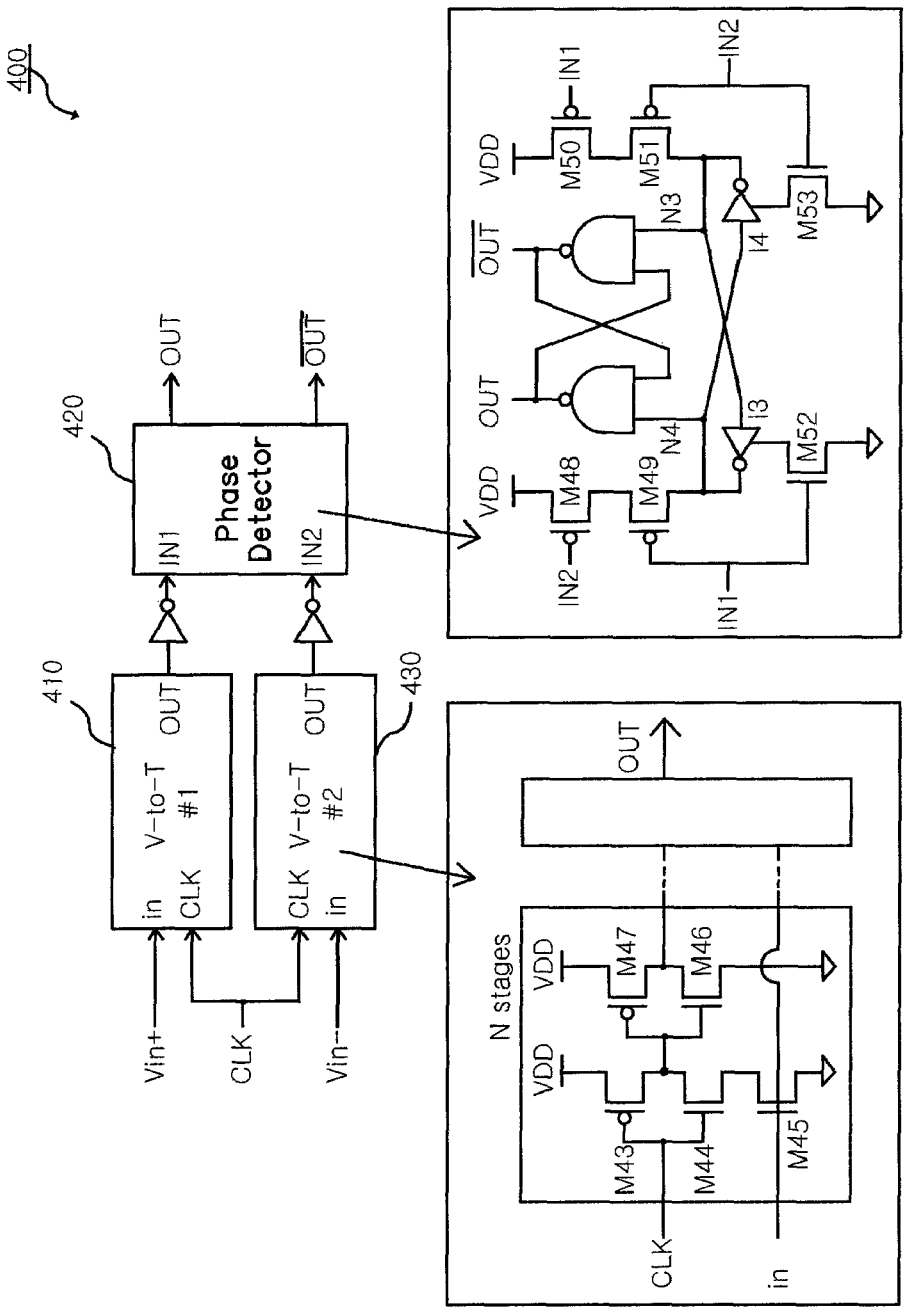
FIG. 4 is a block diagram illustrating the configuration of a time-domain voltage comparator for an analog-to-digital converter in accordance with another embodiment of the present invention.

FIG. 4 is a block diagram illustrating the configuration of a time-domain voltage comparator for an analog-to-digital converter in accordance with another embodiment of the present invention.

Referring to FIG. 4, a time-domain voltage comparator 400 for an analog-to-digital converter in accordance with another embodiment of the present invention includes a first voltage-to-time converter 410 configured to convert an inputted voltage into a time, a second voltage-to-time converter 430 configured to convert an inputted voltage into a time, and a phase detector 420 configured to detect the phases of time information converted in the first voltage-to-time converter 410 and the second voltage-to-time converter 430.

Since operation of the time-domain voltage comparator 400 in accordance with another embodiment of the present invention, configured as shown in FIG. 4, is similar to that of the time-domain voltage comparator 300 shown in FIG. 3, only the differences therebetween will be mainly described below.

The time-domain voltage comparator 400 in accordance with another embodiment of the present invention, configured as shown in FIG. 4, is characterized in that only pull-down paths are controlled to control transition times of rising edges.

The first voltage-to-time converter 410 and the second voltage-to-time converter 430 have the same circuit configuration.

For reference, the configuration and operation of the phase detector 420 shown in FIG. 4 are the same as those of the phase detector 320 shown in FIG. 3.

A difference resides in that the first and second voltage-to-time converters 310 and 330 shown in FIG. 3 receive both positive and negative input voltages Vin+ and Vin−, whereas the first and second voltage-to-time converters 410 and 430 shown in FIG. 4 receive any one of positive and negative input voltages Vin+ and Vin−.

The second voltage-to-time converter 430 uses N stages of time delay cells so that matchability of the voltage-to-time converters can be improved.

A capacitor and a resistor which occupy a large area in an integrated circuit are removed from each time delay cell so that an area of the integrated circuit can be effectively reduced.

In the respective voltage-to-time converters 410 and 430, if a clock signal CLK is low, a low level is quickly transmitted to an output terminal as in an inverter chain so as to be ready to receive a rising edge.

Thereafter, if the clock signal CLK transits to a high level, a difference is caused in the transition times of outputs OUT depending upon the input voltages Vin.

That is to say, if the positive input voltage Vin+ is higher than the negative input voltage Vin−, the output OUT of the first voltage-to-time converter 410 transits earlier. In an opposite case, the output OUT of the second voltage-to-time converter 430 transits earlier.

This will be described below in comparison with FIG. 3.

When compared to the first and second voltage-to-time converters 310 and 330 shown in FIG. 3, the first and second voltage-to-time converters 410 and 430 shown in FIG. 4 are composed of circuits from which the input PMOSes M36 are removed in the same manner.

A difference between FIG. 3 and FIG. 4 is that the time delay cells of the first and second voltage-to-time converters 310 and 330 shown in FIG. 3 control both pull-up and pull-down paths, whereas the time delay cells of the first and second voltage-to-time converters 410 and 430 shown in FIG. 4 control only pull-down paths.

Namely, in FIG. 3, the second voltage-to-time converter 330 controls both the pull-down path of the input NMOS M33 of a first inverter chain and the pull-up path of the input PMOS M36 of a second inverter chain.

However, in FIG. 4, the second voltage-to-time converter 430 controls the pull-down path of a first inverter chain, and a second inverter chain only performs a function of feeding back an inverted signal.

Figure 5:
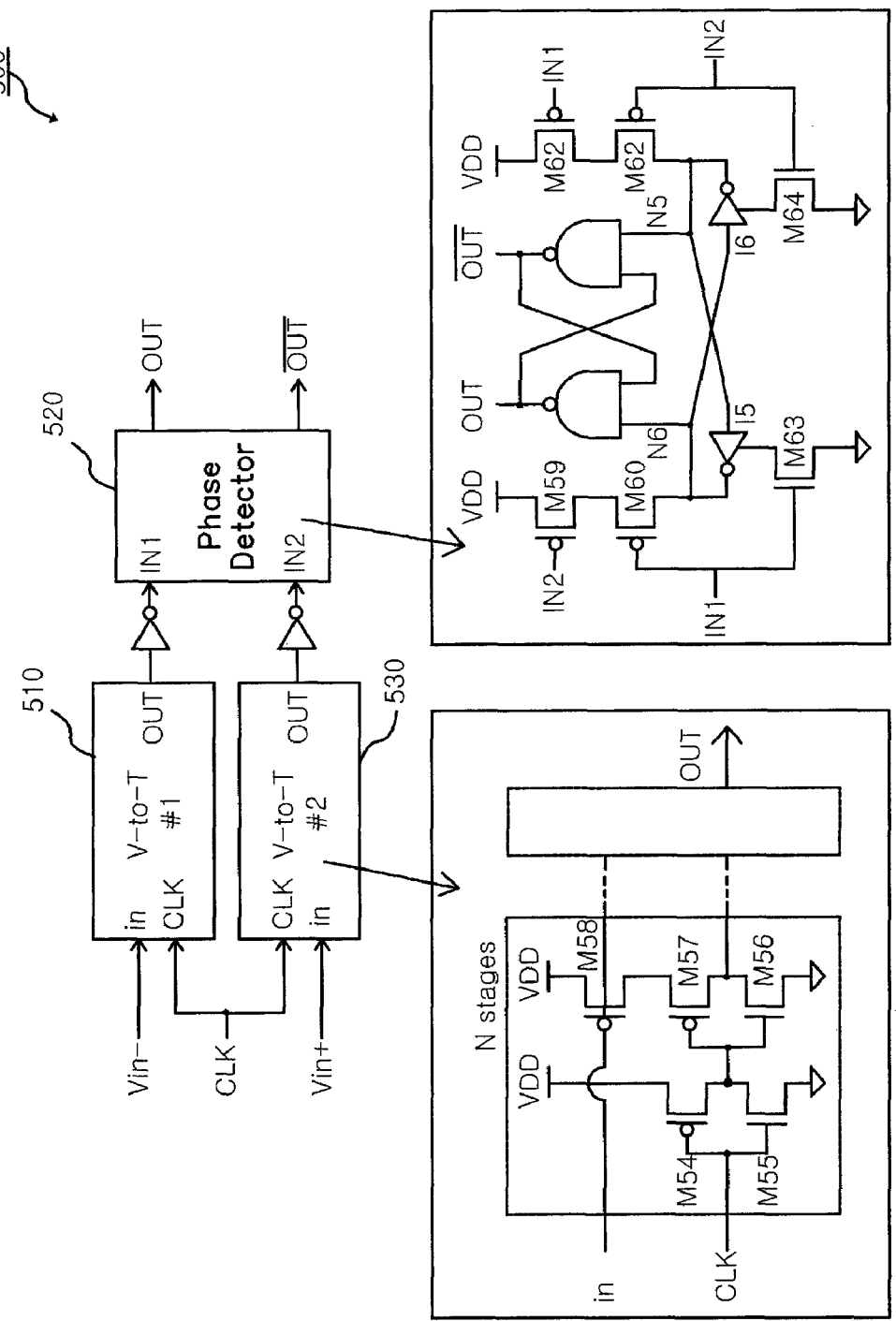
FIG. 5 is a block diagram illustrating the configuration of a time-domain voltage comparator for an analog-to-digital converter in accordance with another embodiment of the present invention.

FIG. 5 is a block diagram illustrating the configuration of a time-domain voltage comparator for an analog-to-digital converter in accordance with another embodiment of the present invention.

Referring to FIG. 5, a first voltage-to-time converter 510 and a second voltage-to-time converter 530 are configured by removing the input NMOS M33 from the configuration of the time delay cell shown in FIG. 3.

That is to say, FIG. 5 shows a configuration in which the input NMOS M33 is removed from the time delay cell of FIG. 3 and an input PMOS 58 remains.

Thus, the time-domain voltage comparator 500 in accordance with another embodiment of the present invention, configured as shown in FIG. 5, is characterized in that only pull-up paths are controlled to control transition times of rising edges.

In the respective voltage-to-time converters 510 and 530, when a clock signal CLK is low, a low level is quickly transmitted to an output terminal as in an inverter chain so as to be ready to receive a rising edge (rising edges are compared in all of FIGS. 3 through 5).

This is realized by changing the polarities of input voltages.

That is to say, while a positive input voltage Vin+ and a negative input voltage Vin− are respectively supplied to the first voltage-to-time converter 410 and the second voltage-to-time converter 430 in FIG. 4, a negative input voltage Vin− and a positive input voltage Vin+ are respectively supplied to the first voltage-to-time converter 510 and the second voltage-to-time converter 530 in FIG. 5.

In this way, by adding serially a transistor (an NMOS or a PMOS) to each time delay cell, the pull-up and pull-down paths of the inverter chains can be controlled to place a priority in differences in the transition times of the outputs.

Figure 6:
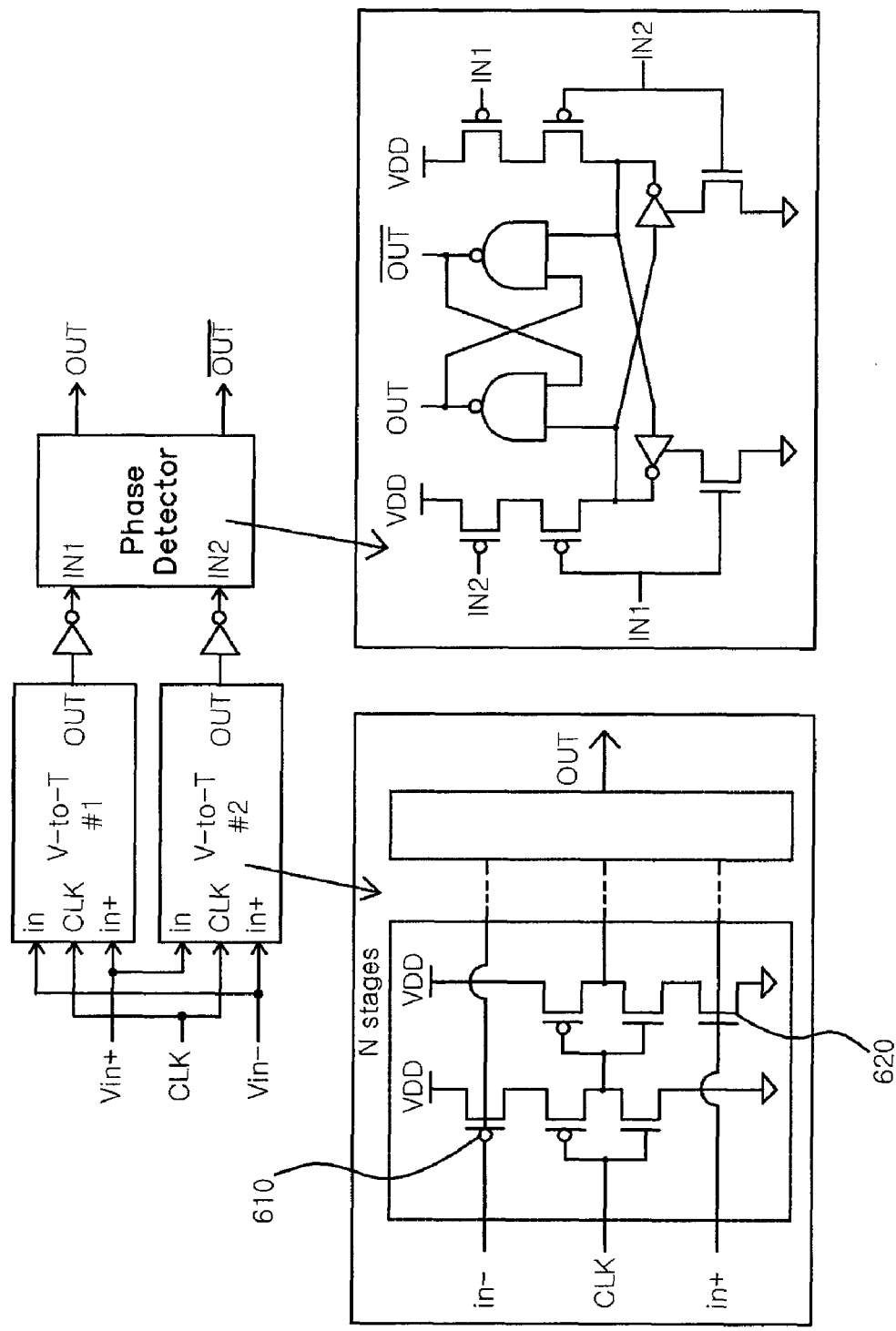
FIG. 6 is a block diagram illustrating time delay cells for controlling a transition time of a falling edge by controlling both a pull-up path and a pull-down path.
Figure 7:
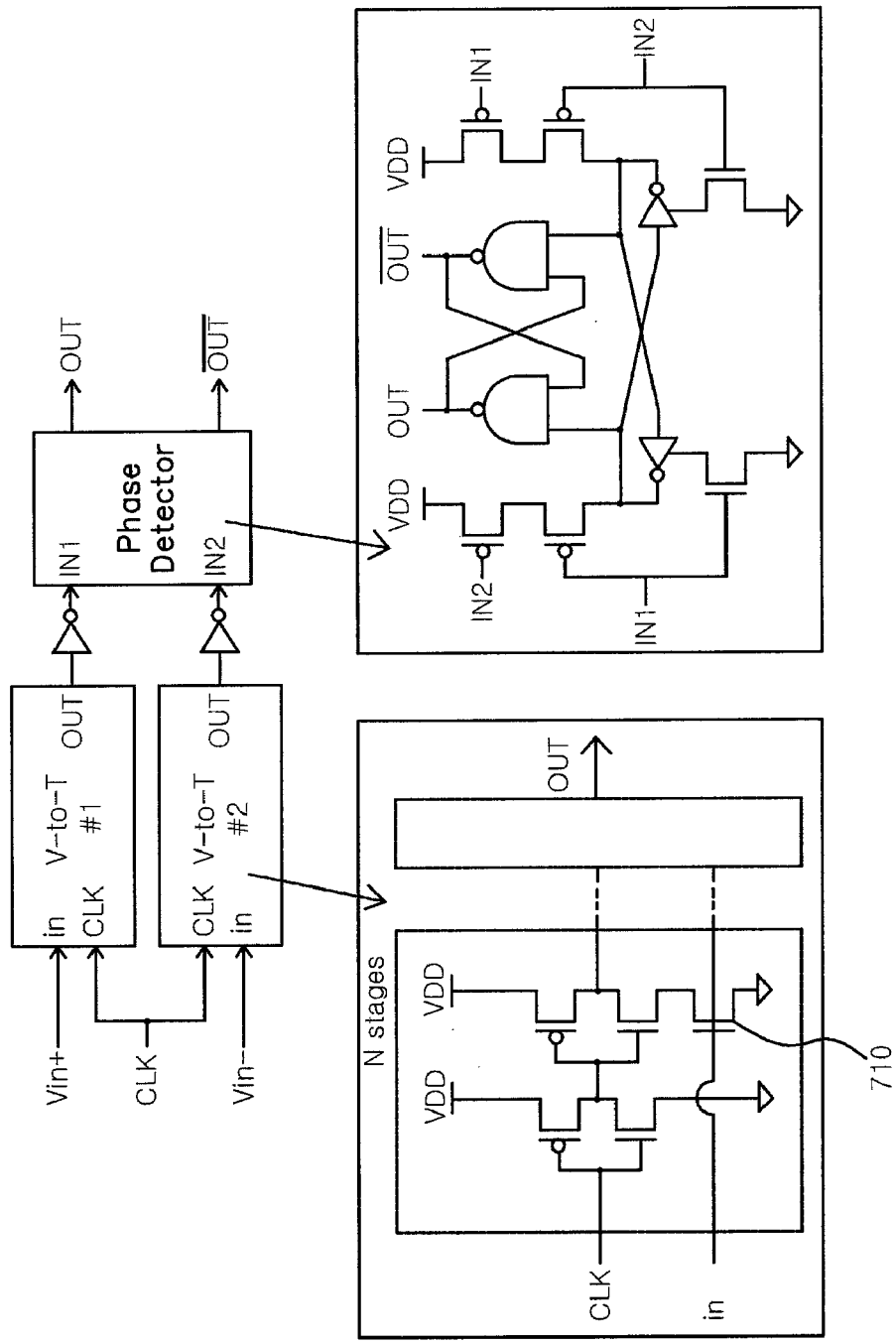
FIG. 7 is a block diagram illustrating time delay cells for controlling a transition time of a falling edge by controlling only a pull-down path.
Figure 8:
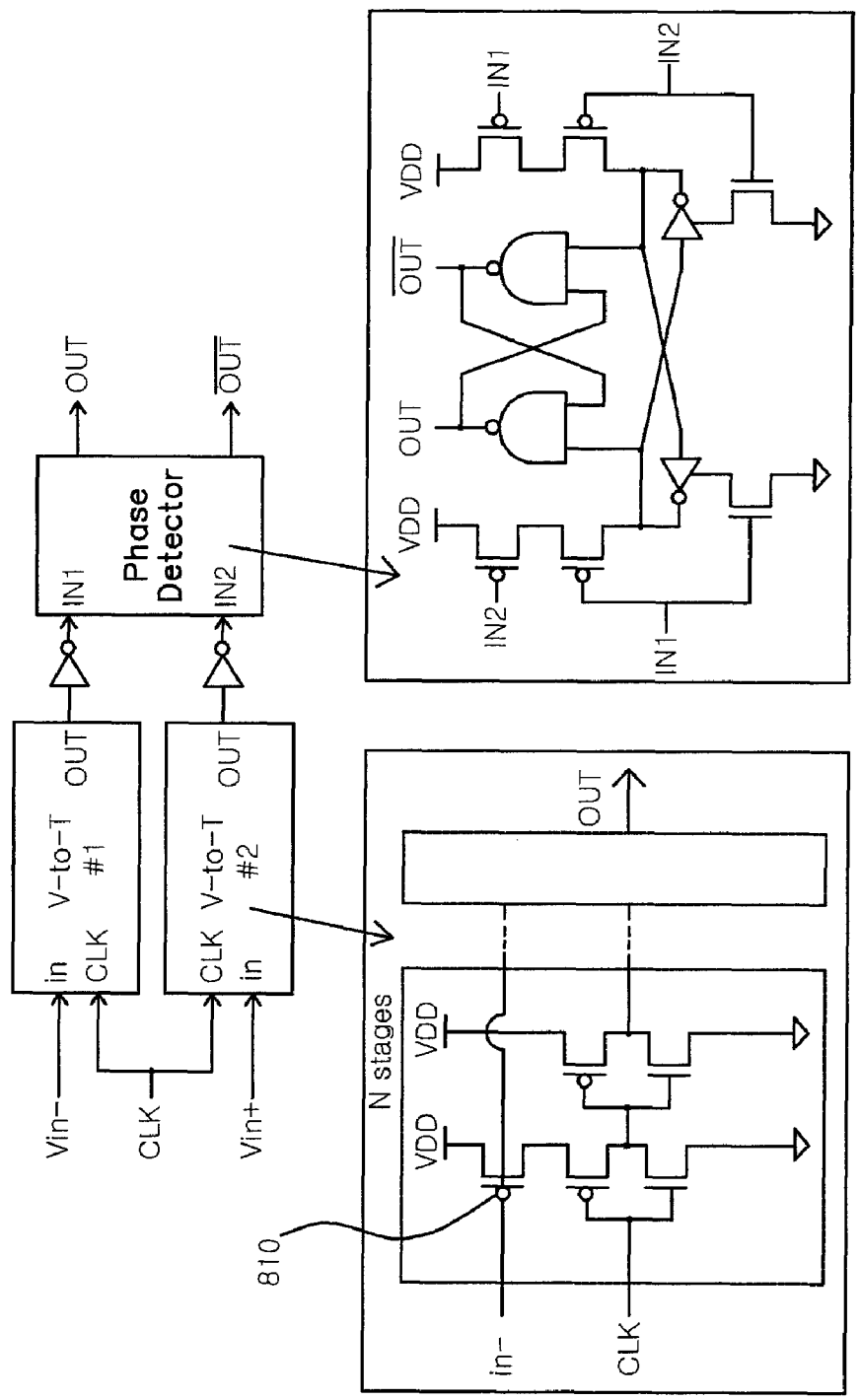
FIG. 8 is a block diagram illustrating time delay cells for controlling a transition time of a falling edge by controlling only a pull-up path.

FIGS. 6 through 8 are circuit diagrams showing examples in which pull-up or pull-down paths are controlled to control the transition times of falling edges. In FIGS. 6 through 8, the reason why inverters are connected to output terminals OUT of respective voltage-to-time converters resides in that, since a phase detector detects a difference in rising edges, it is necessary to invert a difference in the transition speeds of falling edges outputted from the voltage-to-time converters into a difference in the transition speeds of rising edges.

A time delay cell for controlling a transition time of a falling edge by controlling both pull-up paths and pull-down paths in FIG. 6 is realized by changing the positions of an input PMOS 610 and an input NMOS 620 of the time delay cell for controlling a transition time of a rising edge by controlling both the pull-up paths and the pull-down paths in FIG. 3.

Similarly, a time delay cell for controlling a transition time of a falling edge by controlling only pull-down paths in FIG. 7 is realized by changing the position of an input NMOS 710 of the time delay cell for controlling a transition time of a rising edge by controlling only the pull-down paths in FIG. 4.

Moreover, a time delay cell for controlling a transition time of a falling edge by controlling only pull-up paths in FIG. 8 is realized by changing the position of an input PMOS 810 of the time delay cell for controlling a transition time of a rising edge by controlling only the pull-up paths in FIG. 5.

Therefore, the time delay cell according to the present invention can be realized in conformity with various embodiments as shown in FIGS. 3 through 8. That is to say, there are six methods including two methods of controlling a rising edge and a falling edge by controlling both pull-up paths and pull-down paths, two methods of controlling a rising edge and a falling edge by controlling only pull-up paths, and two methods of controlling a rising edge and a falling edge by controlling only pull-down paths.

Figure 9:
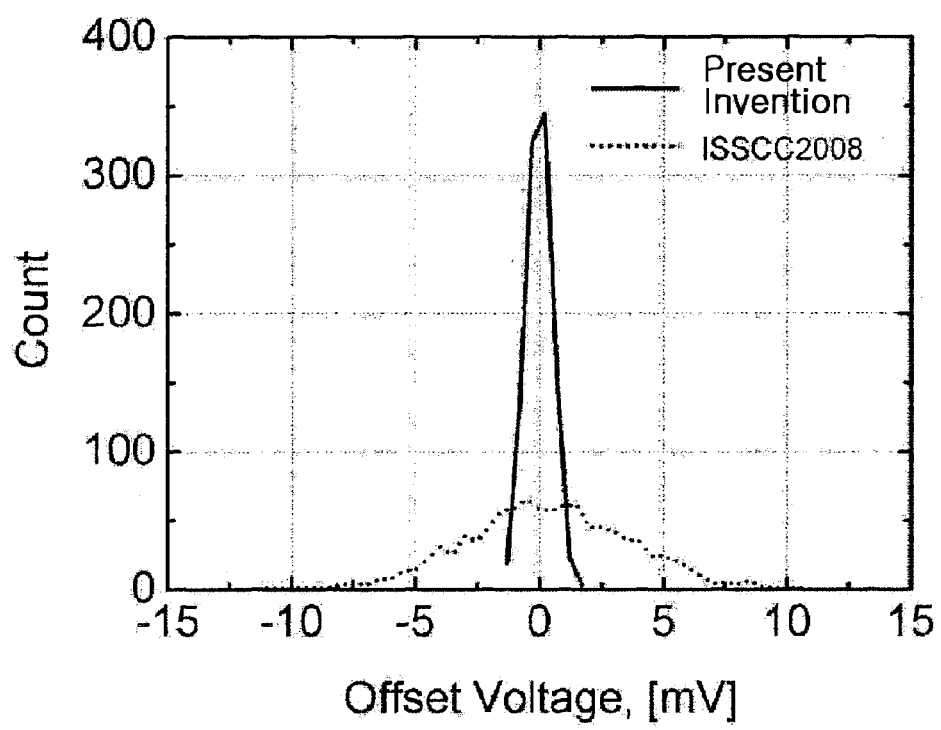
FIG. 9 is a graph showing computer simulation results of the time-domain voltage comparator for an analog-to-digital converter according to the embodiments of the present invention and the conventional time-domain voltage comparator released on the ISSCC.

FIG. 9 is a graph showing computer simulation results of the time-domain voltage comparator for an analog-to-digital converter according to the embodiments of the present invention and the conventional time-domain voltage comparator released on the ISSCC.

Here, the simulation result of the conventional time-domain voltage comparator shown by the dotted line represents the result obtained through operation under a supply voltage of 1V, and the simulation result of the present time-domain voltage comparator shown by the solid line represents the result obtained through operation under a supply voltage of 0.5V.

In particular, since the conventional comparator exhibits a negligibly low operation speed under the supply voltage of 0.5V such that it cannot properly perform the function of a comparator, the simulation result under this condition has been omitted.

Rather, the present comparator operated under the supply voltage of 0.5V has exhibited an operation speed higher than the operation speed obtained when the conventional comparator is operated under the supply voltage of 1V.

In order to demonstrate sensitivity to similar offsets, offset voltages were measured by randomly varying the sizes of all NMOSes and PMOSes within 5% and the values of resistance and capacitance within 5% to have the Gaussian distribution and repeatedly conducting simulations 1,000 times.

In the graph shown in FIG. 9, the abscissa represents an offset voltage and the ordinate represents the number of comparators having a corresponding offset voltage.

As a result of performing Monte-Carlo simulations 1,000 times, it was found that the voltage-to-time converter proposed in the present invention reveals a narrow dispersion with respect to changes in the characteristics of devices even under a very low supply voltage of 0.5V, has a large gain (output time difference/input voltage difference), and operates stably.

As is apparent from the above description, the present invention provides advantages in that, since improved stability can be ensured when compared to the conventional analog comparator, the time-domain voltage comparator according to the present invention can not only be applied to a low voltage/low power analog-to-digital converter, but also be used as a general-purpose voltage comparator.

Also, in the present invention, an analog circuit is minimized to ensure stable operation even in a low voltage condition so that a module can be miniaturized. Further, in the present invention, a plurality of time delay units are used in the course of converting voltage differences into time differences so that insensitivity to the thermal noise of transistors is improved when compared to the conventional comparator and an offset is decreased to reduce power consumption.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A time-domain voltage comparator for an analog-to-digital converter, comprising:
   a first voltage-to-time converter configured to be connected in series with at least one time delay cell and convert an input voltage into time information;
   a second voltage-to-time converter configured to be connected in series with at least one time delay cell and convert an input voltage into time information; and
   a phase detector configured to determine a difference between times outputted from the first voltage-to-time converter and the second voltage-to-time converter,
   wherein, in order to control a transition time of a rising edge by controlling a pull-up path, the time delay cell comprises:
      a first PMOS having a source terminal which is connected to a power supply terminal, and a gate terminal which is connected to a clock signal terminal;
      a first NMOS having a drain terminal which is connected to a drain terminal of the first PMOS, a gate terminal which is connected to the clock signal terminal, and a source terminal which is connected to a ground terminal;
      a second PMOS having a gate terminal which is commonly connected to the drain terminals of the first PMOS and the first NMOS;
      an input PMOS having a source terminal which is connected to the power supply terminal, a gate terminal which is connected to a positive input voltage terminal or a negative input voltage terminal, and a drain terminal which is connected to a source terminal of the second PMOS; and
      a second NMOS having a drain terminal which is connected to a drain terminal of the second PMOS, a gate terminal which is commonly connected to the drain terminals of the first PMOS and the first NMOS, and a source terminal which is connected to the ground terminal.

2. A time-domain voltage comparator for an analog-to-digital converter, comprising:
a first voltage-to-time converter configured to be connected in series with at least one time delay cell and convert an input voltage into time information;
a second voltage-to-time converter configured to be connected in series with at least one time delay cell and convert an input voltage into time information; and
a phase detector configured to determine a difference between times outputted from the first voltage-to-time converter and the second voltage-to-time converter,
wherein, in order to control a transition time of a rising edge by controlling a pull-down path, the time delay cell comprises:
a first PMOS having a source terminal which is connected to a power supply terminal, and a gate terminal which is connected to a clock signal terminal;
a first NMOS having a drain terminal which is connected to a drain terminal of the first PMOS, and a gate terminal which is connected to the clock signal terminal;
an input NMOS having a drain terminal which is connected to a source terminal of the first NMOS, a gate terminal which is connected to a positive input voltage terminal or a negative input voltage terminal, and a source terminal which is connected to a ground terminal;
a second PMOS having a source terminal which is connected to the power supply terminal, and a gate terminal which is commonly connected to the drain terminals of the first PMOS and the first NMOS; and
a second NMOS having a drain terminal which is connected to a drain terminal of the second PMOS, a gate terminal which is commonly connected to the drain terminals of the first PMOS and the first NMOS, and a source terminal which is connected to the ground terminal.

3. A time-domain voltage comparator for an analog-to-digital converter, comprising:
a first voltage-to-time converter configured to be connected in series with at least one time delay cell and convert an input voltage into time information;
a second voltage-to-time converter configured to be connected in series with at least one time delay cell and convert an input voltage into time information; and
a phase detector configured to determine a difference between times outputted from the first voltage-to-time converter and the second voltage-to-time converter,
wherein, in order to control a transition time of a falling edge by controlling a pull-up path, the time delay cell comprises:
an input PMOS having a source terminal which is connected to a power supply terminal, and a gate terminal which is connected to a positive input voltage terminal or a negative input voltage terminal;
a first PMOS having a source terminal which is connected to a drain terminal of the input PMOS, and a gate terminal which is connected to a clock signal terminal;
a first NMOS having a drain terminal which is connected to a drain terminal of the first PMOS, a gate terminal which is connected to the clock signal terminal, and a source terminal which is connected to a ground terminal;
a second PMOS having a source terminal which is connected to the power supply terminal, and a gate terminal which is commonly connected to the drain terminals of the first PMOS and the first NMOS; and
a second NMOS having a drain terminal which is connected to a drain terminal of the second PMOS, a gate terminal which is commonly connected to the drain terminals of the first PMOS and the first NMOS, and a source terminal which is connected to the ground terminal.

4. A time-domain voltage comparator for an analog-to-digital converter, comprising:
a first voltage-to-time converter configured to be connected in series with at least one time delay cell and convert an input voltage into time information;
a second voltage-to-time converter configured to be connected in series with at least one time delay cell and convert an input voltage into time information; and
a phase detector configured to determine a difference between times outputted from the first voltage-to-time converter and the second voltage-to-time converter,
wherein, in order to control a transition time of a falling edge by controlling a pull-down path, the time delay cell comprises:
a first PMOS having a source terminal which is connected to a power supply terminal, and a gate terminal which is connected to a clock signal terminal;
a first NMOS having a drain terminal which is connected to a drain terminal of the first PMOS, a gate terminal which is connected to the clock signal terminal, and a source terminal which is connected to a ground terminal;
a second PMOS having a source terminal which is connected to the power supply terminal, and a gate terminal which is commonly connected to the drain terminals of the first PMOS and the first NMOS;
a second NMOS having a drain terminal which is connected to a drain terminal of the second PMOS, and a gate terminal which is commonly connected to the drain terminals of the first PMOS and the first NMOS; and
an input NMOS having a drain terminal which is connected to a source terminal of the second NMOS, a gate terminal which is connected to a positive input voltage terminal or a negative input voltage terminal, and a source terminal which is connected to the ground terminal.

5. A time-domain voltage comparator for an analog-to-digital converter, comprising:
a first voltage-to-time converter configured to be connected in series with at least one time delay cell and convert an input voltage into time information;
a second voltage-to-time converter configured to be connected in series with at least one time delay cell and convert an input voltage into time information; and
a phase detector configured to determine a difference between times outputted from the first voltage-to-time converter and the second voltage-to-time converter,
wherein, in order to control a transition time of a rising edge by controlling both a pull-up path and a pull-down path, the time delay cell comprises:
a first PMOS having a source terminal which is connected to a power supply terminal, and a gate terminal which is connected to a clock signal terminal;

a first NMOS having a drain terminal which is connected to a drain terminal of the first PMOS, and a gate terminal which is connected to the clock signal terminal;

an input NMOS having a drain terminal which is connected to a source terminal of the first NMOS, a gate terminal which is connected to a positive input voltage terminal or a negative input voltage terminal, and a source terminal which is connected to a ground terminal;

a second PMOS having a gate terminal which is commonly connected to the drain terminals of the first PMOS and the first NMOS;

an input PMOS having a source terminal which is connected to the power supply terminal, a gate terminal which is connected to the positive input voltage terminal or the negative input voltage terminal, and a drain terminal which is connected to a source terminal of the second PMOS; and a second NMOS having a drain terminal which is connected to a drain terminal of the second PMOS, a gate terminal which is commonly connected to the drain terminals of the first PMOS and the first NMOS, and a source terminal which is connected to the ground terminal.

6. A time-domain voltage comparator for an analog-to-digital converter, comprising:

a first voltage-to-time converter configured to be connected in series with at least one time delay cell and convert an input voltage into time information;

a second voltage-to-time converter configured to be connected in series with at least one time delay cell and convert an input voltage into time information; and a phase detector configured to determine a difference between times outputted from the first voltage-to-time converter and the second voltage-to-time converter, wherein, in order to control a transition time of a falling edge by controlling both a pull-up path and a pull-down path, the time delay cell comprises:

an input PMOS having a source terminal which is connected to a power supply terminal, and a gate terminal which is connected to a positive input voltage terminal or a negative input voltage terminal;

a first PMOS having a source terminal which is connected to a drain terminal of the input PMOS, and a gate terminal which is connected to a clock signal terminal;

a first NMOS having a drain terminal which is connected to a drain terminal of the first PMOS, a gate terminal which is connected to the clock signal terminal, and a source terminal which is connected to a ground terminal;

a second PMOS having a source terminal which is connected to the power supply terminal, and a gate terminal which is commonly connected to the drain terminals of the first PMOS and the first NMOS;

a second NMOS having a drain terminal which is connected to a drain terminal of the second PMOS, and a gate terminal which is commonly connected to the drain terminals of the first PMOS and the first NMOS; and an input NMOS having a drain terminal which is connected to a source terminal of the second NMOS, a gate terminal which is connected to the positive input voltage terminal or the negative input voltage terminal, and a source terminal which is connected to the ground terminal.

7. A time-domain voltage comparator for an analog-to-digital converter, comprising:

a first voltage-to-time converter configured to be connected in series with at least one time delay cell and convert an input voltage into time information;

a second voltage-to-time converter configured to be connected in series with at least one time delay cell and convert an input voltage into time information; and a phase detector configured to determine a difference between times outputted from the first voltage-to-time converter and the second voltage-to-time converter, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

8. The time-domain voltage comparator according to claim 7, wherein the latch comprises two inverters which are connected such that output terminals of one and the other inverters are respectively connected to input terminals of the other and one inverters.

9. The time-domain voltage comparator according to claim 7, wherein the RS latch flip-flop comprises two NAND gates.

10. The time-domain voltage comparator according to claim 1, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

11. The time-domain voltage comparator according to claim 10, wherein the latch comprises two inverters which are connected such that output terminals of one and the other inverters are respectively connected to input terminals of the other and one inverters, and wherein the RS latch flip-flop comprises two NAND gates.

12. The time-domain voltage comparator according to claim 2, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

13. The time-domain voltage comparator according to claim 3, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

14. The time-domain voltage comparator according to claim 4, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

15. The time-domain voltage comparator according to claim 5, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

16. The time-domain voltage comparator according to claim 15, wherein the latch comprises two inverters which are connected such that output terminals of one and the other inverters are respectively connected to input terminals of the other and one inverters.

17. The time-domain voltage comparator according to claim 15, wherein the RS latch flip-flop comprises two NAND gates.

18. The time-domain voltage comparator according to claim 6, wherein the phase detector comprises:

a third PMOS and a fourth PMOS configured to be connected in series to the power supply terminal and be respectively turned on by an output of the second voltage-to-time converter and an output of the first voltage-to-time converter;

a fifth PMOS and a sixth PMOS configured to be connected in series to the power supply terminal and be respectively turned on by the output of the first voltage-to-time converter and the output of the second voltage-to-time converter;

a third NMOS configured to be turned on by the output of the first voltage-to-time converter and transit a voltage of one output terminal of a latch to a low level;

a fourth NMOS configured to be turned on by the output of the second voltage-to-time converter and transit a voltage of the other output terminal of the latch to a low level;

an inverter latch configured to be precharged at both input and output terminals thereof through the third and fourth PMOSes and the fifth and sixth PMOSes and then latch values corresponding to operations of the third and fourth NMOSes; and an RS latch flip-flop configured to generate an output and an inverted output corresponding to values outputted to both output terminals of the latch.

19. The time-domain voltage comparator according to claim 18, wherein the latch comprises two inverters which are connected such that output terminals of one and the other inverters are respectively connected to input terminals of the other and one inverters.

20. The time-domain voltage comparator according to claim 18, wherein the RS latch flip-flop comprises two NAND gates.

* * * * *